US009620662B2

(12) United States Patent
Yamamoto et al.

(10) Patent No.: US 9,620,662 B2
(45) Date of Patent: Apr. 11, 2017

(54) ULTRAVIOLET SENSOR AND ULTRAVIOLET DETECTING DEVICE

(71) Applicant: HAMAMATSU PHOTONICS K.K., Hamamatsu-shi, Shizuoka (JP)

(72) Inventors: Koei Yamamoto, Hamamatsu (JP); Kenzo Hayatsu, Hamamatsu (JP); Terumasa Nagano, Hamamatsu (JP); Yuki Okuwa, Hamamatsu (JP); Ryuta Yamada, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 20 days.

(21) Appl. No.: 14/855,968

(22) Filed: Sep. 16, 2015

(65) Prior Publication Data

US 2016/0086989 A1    Mar. 24, 2016

(30) Foreign Application Priority Data

Sep. 19, 2014    (JP) .................................. 2014-191379

(51) Int. Cl.
*H01L 31/107*    (2006.01)
*H01L 31/028*    (2006.01)
*H01L 27/146*    (2006.01)

(52) U.S. Cl.
CPC ...... *H01L 31/107* (2013.01); *H01L 27/14603* (2013.01); *H01L 27/14618* (2013.01); *H01L 27/14625* (2013.01); *H01L 27/14636* (2013.01); *H01L 27/14643* (2013.01); *H01L 31/028* (2013.01); *H01L 2224/48091* (2013.01);

(Continued)

(58) Field of Classification Search
CPC ........................... H01L 31/107; H01L 31/028
See application file for complete search history.

(56) References Cited

U.S. PATENT DOCUMENTS

2010/0214654 A1* 8/2010 Birk .......................... G01J 1/44
359/385
2010/0245809 A1* 9/2010 Andreou ........... H01L 27/14603
356/222

(Continued)

FOREIGN PATENT DOCUMENTS

JP      S63-129837 U    8/1988
JP      H09-229763 A    9/1997

*Primary Examiner* — Julio J Maldonado
*Assistant Examiner* — David S Wilbert
(74) *Attorney, Agent, or Firm* — Drinker Biddle & Reath LLP

(57) ABSTRACT

An ultraviolet sensor includes a silicon photodiode array having a plurality of first pixel regions and a plurality of second pixel regions. A filter film is disposed on each of the first pixel regions so as to cover each first pixel region, except on each second pixel region. The filter film lowers transmittance in a detection target wavelength range in the ultraviolet region. Each of each first pixel region and each second pixel region includes at least one pixel having an avalanche photodiode to operate in Geiger mode, and a quenching resistor connected in series to the avalanche photodiode. Each of the quenching resistors in the plurality of first pixel regions is connected through a first signal line to a first output terminal. Each of the quenching resistors in the plurality of second pixel regions is connected through a second signal line to a second output terminal.

8 Claims, 13 Drawing Sheets

(52) U.S. Cl.
CPC ............... *H01L 2224/48227* (2013.01); *H01L 2924/16195* (2013.01)

(56) References Cited

U.S. PATENT DOCUMENTS

| | | | |
|---|---|---|---|
| 2011/0095388 A1* | 4/2011 | Richter | ............... H01L 27/1446 257/432 |
| 2012/0267746 A1* | 10/2012 | Sanfilippo | ........... H01L 27/1446 257/438 |

* cited by examiner

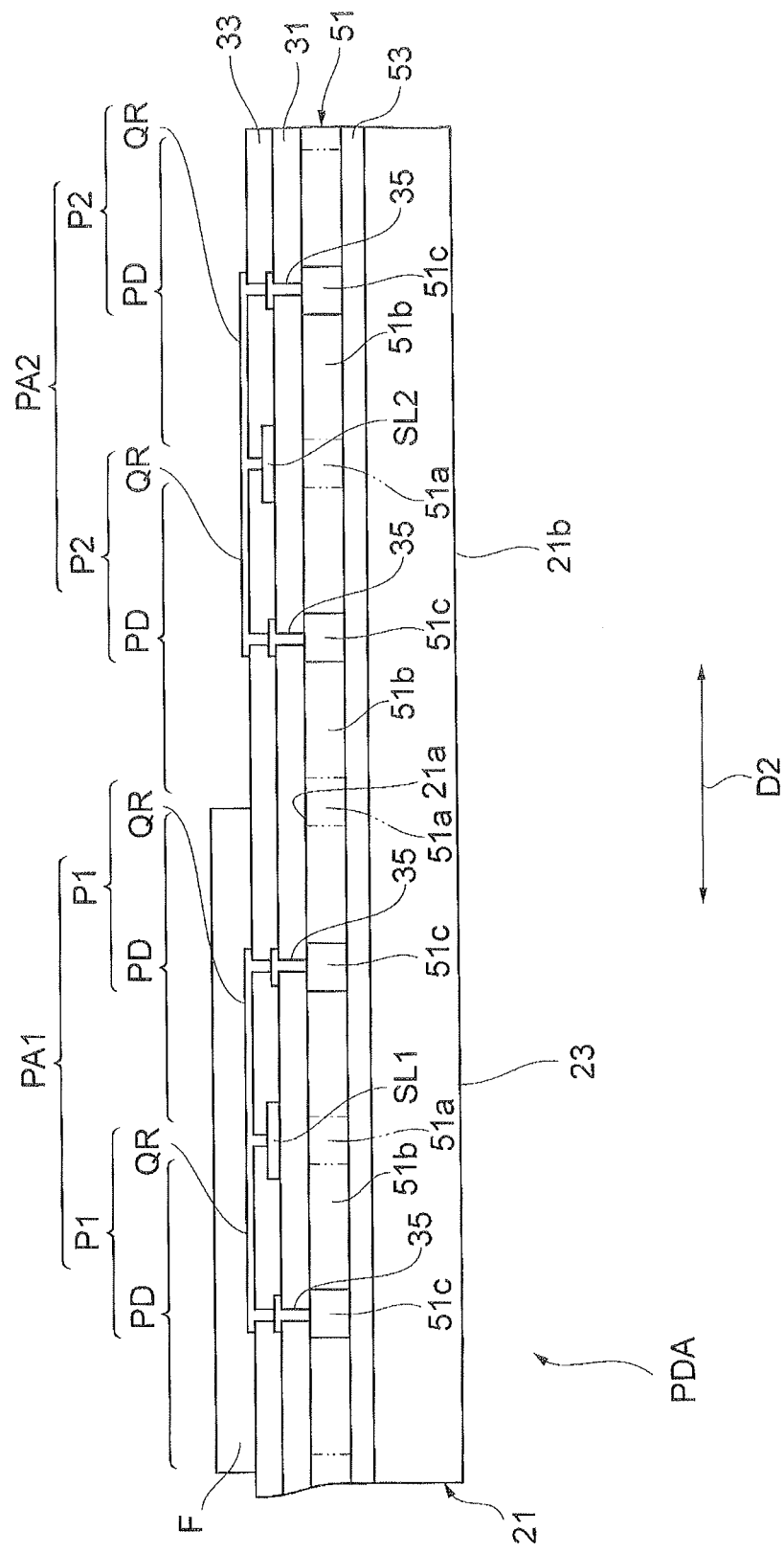

ULTRAVIOLET SENSOR AND ULTRAVIOLET DETECTING DEVICE

BACKGROUND OF THE INVENTION

Field of the Invention

The present invention relates to an ultraviolet sensor and an ultraviolet detecting device provided with the ultraviolet sensor.

Related Background Art

There are known ultraviolet (UV) sensors using compound semiconductors (e.g., cf. Japanese Patent Application Laid-open Publication No. H09-229763). The UV sensor described in the Publication No. H09-229763 includes a sapphire substrate and a compound semiconductor layer formed on the sapphire substrate. This LTV sensor has no sensitivity in a wavelength region longer than a detection target wavelength range in the UV region (e.g., the spectral region C of UV rays (UV-C rays)).

Another known UV sensor is one provided with first and second photodiodes having a spectral sensitivity in a range down to the UV region (e.g., cf. Japanese Unexamined Utility Model Application Publication No. S63-129837). In the UV sensor described in the Publication No. S63-129837, light is incident into the first photodiode, after passing through an optical filter that transmits the UV-A rays and UV-B rays. Light is incident into the second photodiode, after passing through an optical filter that transmits the UV-A rays but blocks the UV-B rays.

SUMMARY OF THE INVENTION

The UV sensor described in the Publication No. H09-229763 has the following problem. When the intensity of light as detection target is low, it is difficult for the UV sensor using the compound semiconductor to achieve a sufficient detection sensitivity characteristic.

The UV sensor described in the Publication No. S63-129837 has the following problem. When the first and second photodiodes used are silicon photodiodes, the silicon photodiodes have a low spectral sensitivity characteristic in the wavelength region of not more than 300 nm. For this reason, it is difficult for the UV sensor using the silicon photodiodes to achieve a sufficient detection sensitivity characteristic in the wavelength region on the short wavelength side such as the UV-C rays. It is also difficult for the foregoing UV sensor to achieve a sufficient detection sensitivity characteristic, when the intensity of light as detection target is low.

An object of one aspect of the present invention is to provide an ultraviolet sensor having a sufficient detection sensitivity characteristic in the UV region. An object of another aspect of the present invention is to provide an ultraviolet detecting device having a sufficient detection sensitivity characteristic in the UV region.

A UV sensor according to one aspect of the present invention includes a silicon photodiode array having a plurality of first pixel regions and a plurality of second pixel regions, which are alternately disposed in a first direction, a filter film lowering transmittance in a detection target wavelength range in the ultraviolet region, a first output terminal connected to outputs of the plurality of first pixel regions, and a second output terminal connected to outputs of the plurality of second pixel regions. The filter film is disposed on each of the first pixel regions so as to cover each first pixel region, except on each second pixel region. Each of each first pixel region and each second pixel region includes at least one pixel including an avalanche photodiode to operate in Geiger mode, and a quenching resistor connected in series to the avalanche photodiode. Each of the quenching resistors in the plurality of first pixel regions is connected through a first signal line to the first output terminal. Each of the quenching resistors in the plurality of second pixel regions is connected through a second signal line to the second output terminal.

In the UV sensor according to the foregoing one aspect, each of each first pixel region and each second pixel region includes at least one pixel having the avalanche photodiode to operate in Geiger mode, and the quenching resistor connected in series to the avalanche photodiode. When light incident to the first pixel region is incident into the avalanche photodiode operating in Geiger mode, the light is absorbed in the avalanche photodiode to generate carriers. When light incident to the second pixel region is incident into the avalanche photodiode operating in Geiger mode, the light is absorbed in the avalanche photodiode to generate carriers. In the avalanche photodiode, the generated carriers are subjected to avalanche multiplication. Therefore, even if the intensity of light incident to the UV sensor is low, the UV sensor can achieve a sufficient detection sensitivity characteristic. The first pixel regions and second pixel regions are alternately disposed in the first direction. This configuration prevents the light incident to the UV sensor from being incident into only either one of the first and second pixel regions. It also prevents the light incident to the UV sensor from being disproportionately incident into either one of the first and second pixel regions. This suppresses occurrence of variation in detection accuracy arising from positions of incidence of light to the UV sensor, whereby the UV sensor can achieve sufficient detection accuracy. Since the filter film is disposed on each of the first pixel regions so as to cover each first pixel region, except on each second pixel region, positional deviation is hard to occur between the filter film and the first and second pixel regions. Therefore, light having passed through the filter film is surely incident to the first pixel regions, while the light having passed through the filter film is not incident to the second pixel regions. This allows the UV sensor to achieve sufficient detection accuracy.

In the UV sensor according to the foregoing one aspect, an output from the avalanche photodiode in each first pixel region can be taken out through the first signal line from the first output terminal and an output from the avalanche photodiode in each second pixel region can be taken out through the second signal line from the second output terminal, independently of each other. The output based on the light incident to the avalanche photodiode after passing through the filter film is taken out from the first output terminal. The output based on the light incident to the avalanche photodiode without passing through the filter film is taken out from the second output terminal. Therefore, by comparing the output from the first output terminal with the output from the second output terminal by use of the UV sensor according to the foregoing one aspect of the present invention, it becomes feasible to detect light in the detection target wavelength range in the UV region.

The plurality of first pixel regions and the plurality of second pixel regions may be two-dimensionally disposed and also alternately disposed in a second direction perpendicular to the first direction. This configuration further prevents the light incident to the UV sensor from being incident into only either one of the first and second pixel regions. It also further prevents the light incident to the UV sensor from being disproportionately incident into either one of the first and second pixel regions. Because of these, the UV sensor can achieve higher detection accuracy.

The filter film may be comprised of a polyparaxylylene resin. In this case, transmittance can be lowered, particularly, in the wavelength region on the short wavelength side such as the UV-C rays, as the detection target wavelength range in the UV region. Since the filter film is disposed on each first pixel region except on each second pixel region, the filter film needs to be formed by patterning. It is easy to implement the patterning of the polyparaxylylene resin. Therefore, the filter film is surely and easily formed on each first pixel region except on each second pixel region.

The UV sensor may further comprise a condenser lens disposed so as to face the silicon photodiode array, and configured to condense incident light. In this case, it is feasible to enhance light condensing capability in the UV sensor and expand a range where light can be incident into the UV sensor.

The UV sensor may further comprise a scattering section disposed so as to face the silicon photodiode array, and configured to scatter incident light to output scattered light. This configuration further prevents the light incident to the UV sensor from being incident into only either one of the first and second pixel regions. It also further prevents the light incident to the UV sensor from being disproportionately incident into either one of the first and second pixel regions. Because of these, the UV sensor can achieve higher detection accuracy.

The UV sensor may further comprise a filter disposed so as to face the silicon photodiode array, and configured to cut light of wavelengths in the visible region traveling toward the silicon photodiode array. A spectral sensitivity characteristic of the avalanche photodiode has a peak in the visible region in general. For this reason, if the quantity of light is higher in the visible region as ambient light than the quantity of light in the UV region, the output from the avalanche photodiode could become saturated. When the output from the avalanche photodiode becomes saturated, it becomes difficult to detect the light in the detection target wavelength range in the UV region. When the filter to cut the light of wavelengths in the visible region is disposed so as to face the silicon photodiode array, it can prevent the output from the avalanche photodiode from becoming saturated.

The silicon photodiode array may include a silicon semiconductor substrate on which an epitaxial semiconductor layer is formed through an insulating layer, and the avalanche photodiodes may be formed in the epitaxial semiconductor layer. In this case, the thickness of the epitaxial semiconductor layer can be set relatively small, or, to the thickness enough to lower the sensitivity in the visible region, without lowering the sensitivity in the UV region. This can prevent the output from the avalanche photodiode from becoming saturated.

A UV detecting device according to another aspect of the present invention includes the foregoing UV sensor, and detects light in the detection target wavelength range in the UV region, based on a difference between an output from the first output terminal and an output from the second output terminal.

The UV detecting device according to the foregoing other aspect includes the aforementioned UV sensor, whereby it can achieve a sufficient detection sensitivity characteristic and sufficient detection accuracy.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 13 is a drawing for explaining a cross-sectional configuration along the line XIII-XIII in FIG. 12.

DESCRIPTION OF THE PREFERRED EMBODIMENTS

The embodiment of the present invention will be described below in detail with reference to the accompanying drawings. In the description, identical elements or elements with identical functionality will be denoted by the same reference signs, without redundant description.

Figure 1:
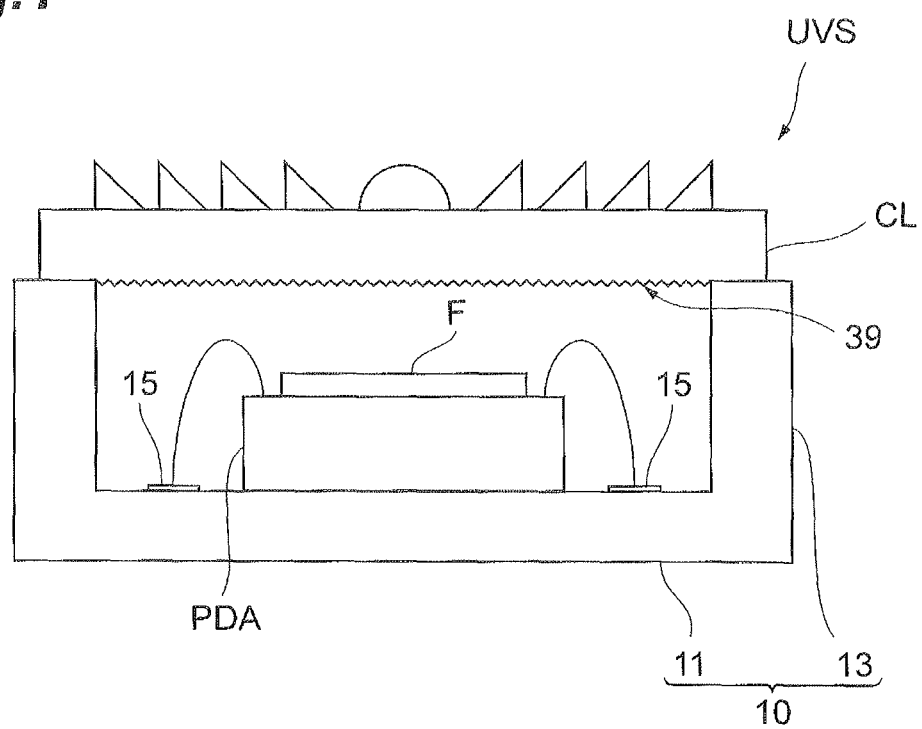
FIG. 1 is a conceptual drawing for explaining a cross-sectional configuration of a UV sensor according to one embodiment.
Figure 2:
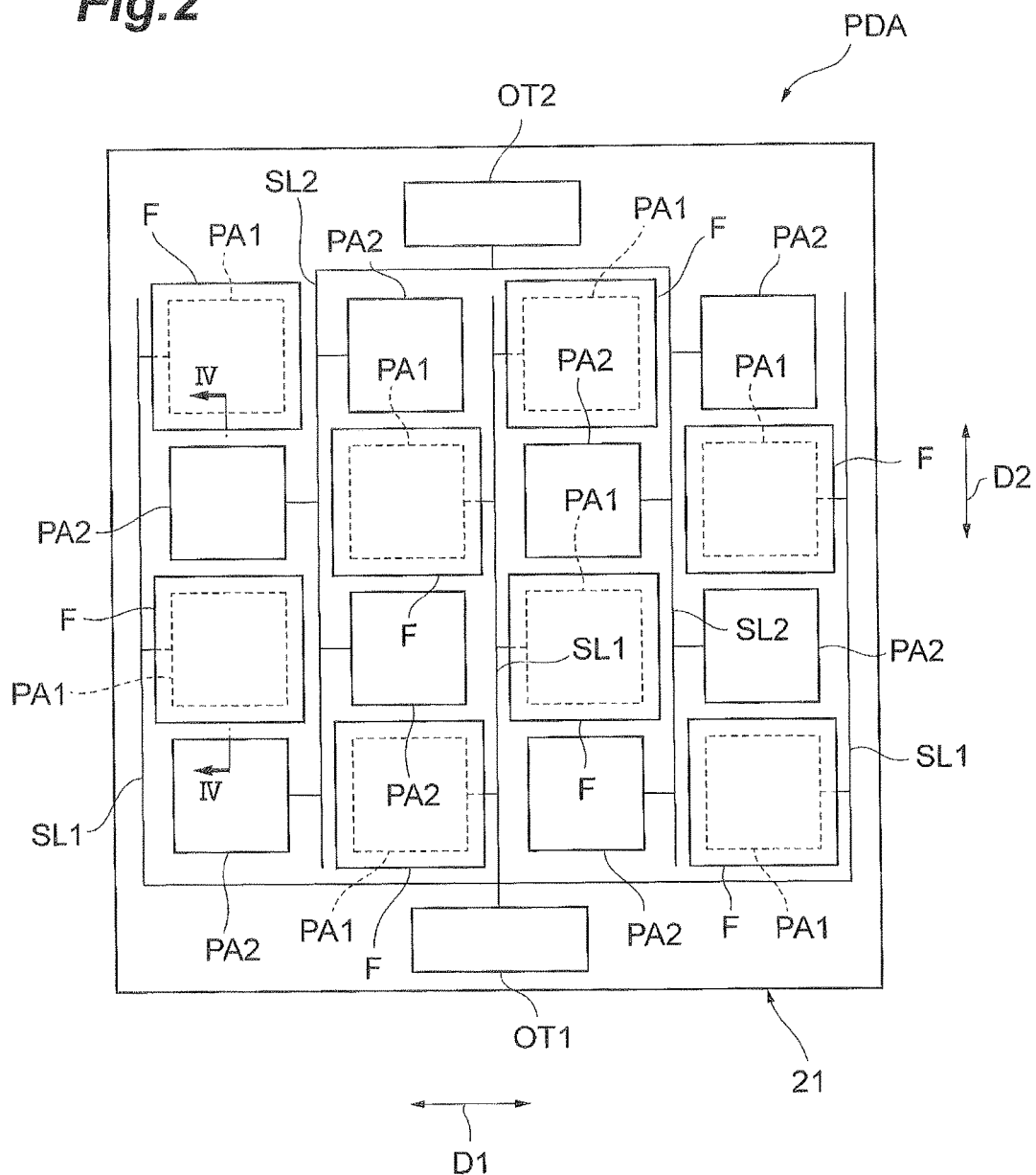
FIG. 2 is a plan view showing a silicon photodiode array, which the UV sensor according to the embodiment includes.
Figure 3:
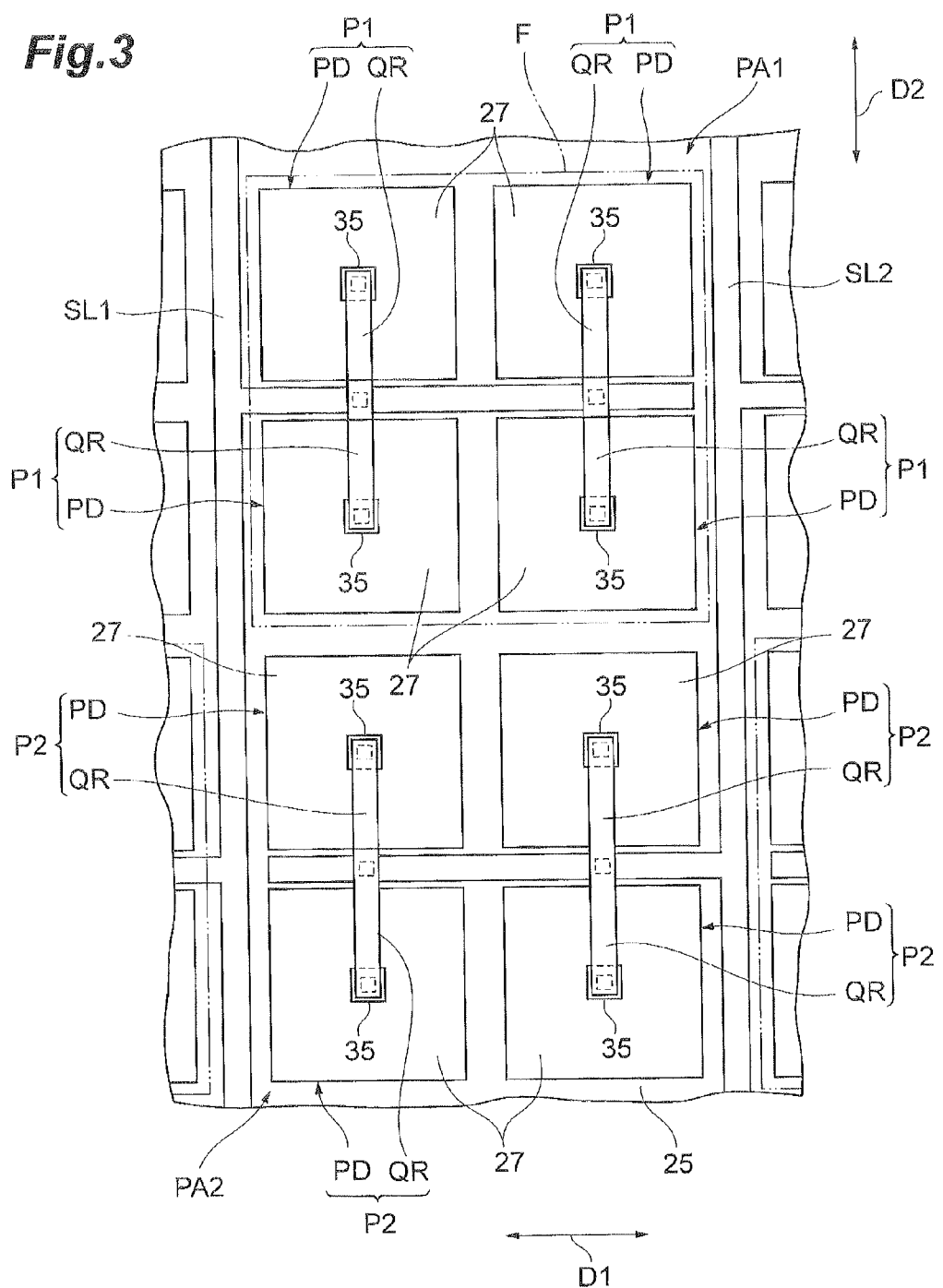
FIG. 3 is a plan view showing a first pixel region and a second pixel region in the silicon photodiode array shown in FIG. 2.
Figure 4:
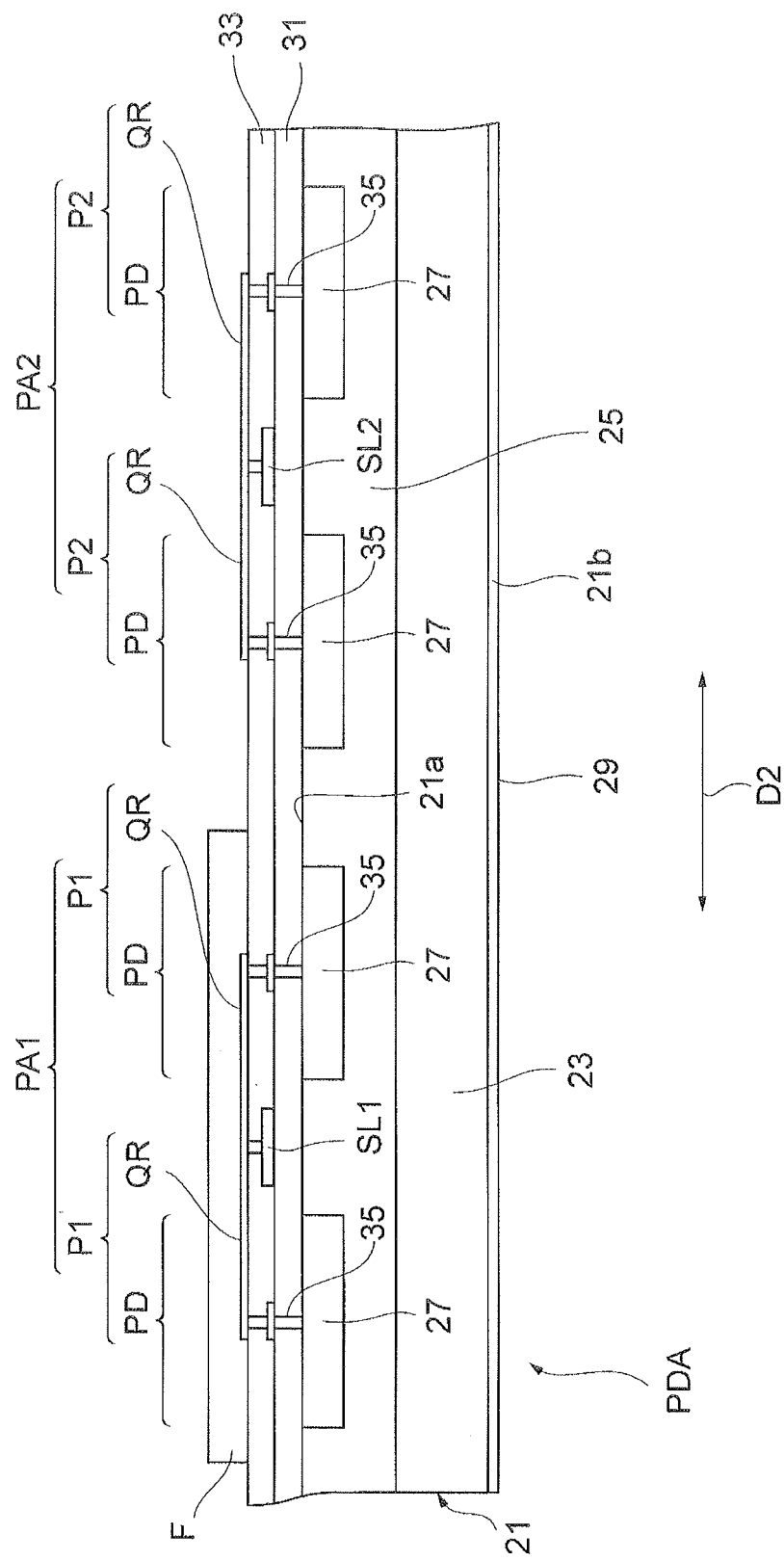
FIG. 4 is a drawing for explaining a cross-sectional configuration along the line IV-IV in FIG. 2.
Figure 5:
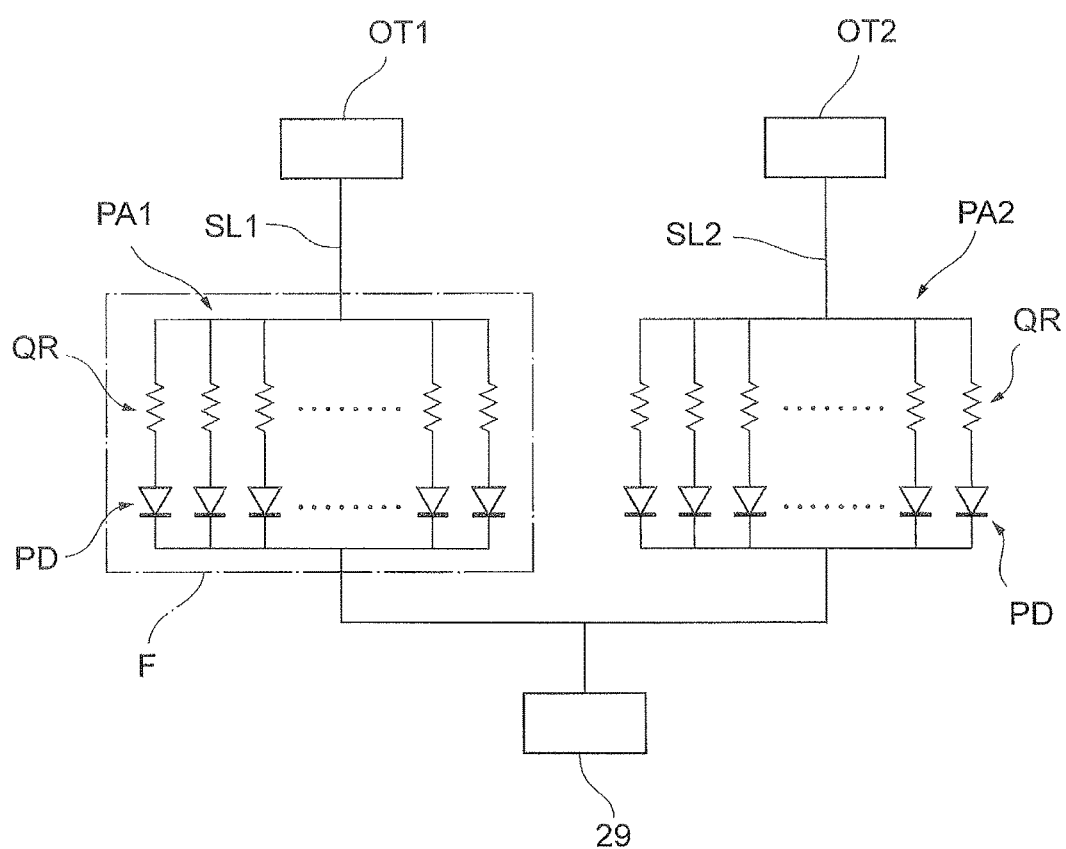
FIG. 5 is a circuit diagram of the UV sensor according to the embodiment.

A configuration of a UV sensor UVS according to the present embodiment will be described with reference to FIGS. 1 to 5. FIG. 1 is a conceptual drawing for explaining a cross-sectional configuration of the UV sensor according to the present embodiment. FIG. 2 is a plan view showing a silicon photodiode array, which the UV sensor according to the present embodiment includes. FIG. 3 is a plan view showing a first pixel region and a second pixel region in the silicon photodiode array shown in FIG. 2. FIG. 4 is a drawing for explaining a cross-sectional configuration along the line IV-IV in FIG. 2. FIG. 5 is a circuit diagram of the UV sensor according to the present embodiment.

The UV sensor UVS, as shown in FIG. 1, includes a package 10, a silicon photodiode array (hereinafter referred to simply as "photodiode array") PDA, a filter film F, and a condenser lens CL. The UV sensor UVS is used, for example, as a flame sensor.

The package 10 has a bottom 11 and a side wall 13. The package 10 has a bottomed shape opening at one end opposite to the bottom 11. In the package 10, the inside space defined by the bottom 11 and the side wall 13 functions as a space for housing the photodiode array PDA. A surface facing the inside space, in the bottom 11 is a surface on which the photodiode array PDA is mounted. The package 10 is made, for example, of a ceramic or the like.

The photodiode array PDA, as shown in FIGS. 2 to 4, includes a silicon semiconductor substrate 21 (hereinafter referred to simply as "semiconductor substrate"). The semiconductor substrate 21 has a pair of principal surfaces 21a, 21b opposed to each other. The semiconductor substrate 21 includes a photodetecting region on the principal surface 21a side. The photodetecting region includes a plurality of first pixel regions PA1 and a plurality of second pixel regions PA2. In the present embodiment, the number of first pixel regions PA1 is set equal to the number of second pixel regions PA2. The principal surface 21a is a light incidence surface.

The plurality of first pixel regions PA1 and the plurality of second pixel regions PA2 are two-dimensionally disposed in a matrix. The first pixel regions PA1 and the second pixel regions PA2 are alternately disposed in a first direction D1 and a second direction D2 perpendicular to each other. In the present embodiment, the first pixel regions PA1 and second pixel regions PA2 are disposed in four rows and four columns.

Each first pixel region PA1 includes at least one pixel P1. In the present embodiment, one first pixel region PA1 includes four pixels P1. The four pixels P1 are two-dimensionally disposed in a matrix. Each second pixel region PA2 includes at least one pixel P2. In the present embodiment, one second pixel region PA2 includes four pixels P2. The four pixels P2 are two-dimensionally disposed in a matrix.

Each pixel P1 or P2 includes a photodiode PD and a quenching resistor QR connected in series to the photodiode PD. The photodiode array PDA includes a plurality of photodiodes PD two-dimensionally disposed in a matrix. In the present embodiment, the photodiodes PD are disposed in eight rows and eight columns. In the present embodiment, the total number of pixels P1 is set equal to the total number of pixels P2.

The semiconductor substrate 21 includes a semiconductor region (layer) 23 of a first conductivity type (e.g., n type) located on the principal surface 21b side, and a semiconductor region (layer) 25 of a second conductivity type (e.g., p type) located on the principal surface 21a side. The semiconductor region 23 and semiconductor region 25 constitute a pn junction. The semiconductor substrate 21 includes a plurality of semiconductor regions 27 of the second conductivity type, corresponding to the respective pixels P1 and P2. The semiconductor regions 27 are located in the semiconductor region 25 and have a higher impurity concentration than the semiconductor region 25. Each photodiode PD includes the n-type semiconductor region 23 and p-type semiconductor region (semiconductor regions 25, 27). An n-type impurity to be used can be phosphorus or arsenic or the like. A p-type impurity to be used can be boron or the like. The conductivity types of p-type and n-type may be switched to the reverse to the foregoing.

An electrode 29 is disposed on the principal surface 21b of the semiconductor substrate 21. The electrode 29 is formed on the semiconductor region 23. Namely, the electrode 29 is in contact with the semiconductor region 23 and is electrically connected to the semiconductor region 23. The electrode 29 is an electrode that supplies a substrate electric potential, and is connected, for example, to a positive electric potential. The electrode 29 is made, for example, of gold or the like.

Two layers of insulating layers 31, 33 are disposed on the principal surface 21a of the semiconductor substrate 21. The insulating layer 31 is formed on the semiconductor regions 25, 27 and the insulating layer 33 is formed on the insulating layer 31. The insulating layers 31, 33 are made of a material that transmits light (light in the wavelength region of UV rays and longer-wavelength rays). The insulating layers 31, 33 are made, for example, of silicon oxide ($SiO_2$) or silicon nitride ($SiN_x$) or the like. FIGS. 2 and 3 are drawn without illustration of the insulating layers 31, 33 shown in FIG. 4, for clarification of structure.

Contact holes are formed in the insulating layer 31 and contact electrodes 35 are disposed in the respective contact holes. The contact electrodes 35 are in contact with the respective semiconductor regions 27 and are electrically connected to the respective semiconductor regions 27. The contact electrodes 35 are made, for example, of aluminum or the like.

The quenching resistors QR are disposed on the insulating layer 33. One ends of the quenching resistors QR are connected to the respective contact electrodes 35 through contact holes formed in the insulating layer 33. Namely, the one ends of the quenching resistors QR are connected through the respective contact electrodes 35 to the corresponding semiconductor regions 27. The quenching resistors QR are connected in series to the respective photodiodes PD, as shown in FIG. 5. The quenching resistors QR may be made of a material that transmits light (light in the wavelength region of UV rays and longer-wavelength rays). The quenching resistors QR are made, for example, of SiCr or WSi or the like.

Each of the other ends of the quenching resistors QR is connected to a signal line (first signal line SL1 or second signal line SL2) through a contact hole formed in the insulating layer 33. Each of the quenching resistors QR of the pixels P1 included in the first pixel regions PA1 is connected to the first signal line SL1. Each of the quenching resistors QR of the pixels P2 included in the second pixel regions PA2 is connected to the second signal line SL2.

The first signal line SL1 and second signal line SL2 are disposed on the insulating layer 31. The first signal line SL1 is connected to outputs of the pixels P1 (photodiodes PD) included in the first pixel regions PA1. The second signal line SL2 is connected to outputs of the pixels P2 (photodiodes PD) included in the second pixel regions PA2. The first signal line SL1 and second signal line SL2 are made, for example, of aluminum or the like.

The first signal line SL1 includes first portions and second portions. The first portions of the first signal line SL1 are located inside the first pixel regions PA1. The second portions of the first signal line SL1 are connected to the first portions of the first signal line SL1 and located outside the first pixel regions PA1. The second portions of the first signal line SL1 are connected to a first output terminal OT1. Namely, the semiconductor regions 27 of the photodiodes PD included in the first pixel regions PA1 are electrically connected to the first output terminal OT1, each through the contact electrode 35, quenching resistor QR, and first signal line SL1. This arrangement makes the outputs of the respective pixels P1 connected to the first output terminal OT1.

The second signal line SL2 includes first portions and second portions. The first portions of the second signal line SL2 are located inside the second pixel regions PA2. The second portions of the second signal line SL2 are connected to the first portions of the second signal line SL2 and located outside the second pixel regions PA2. The second portions of the second signal line SL2 are connected to a second output terminal OT2. Namely, the semiconductor regions 27 of the photodiodes PD included in the second pixel regions PA2 are electrically connected to the second output terminal OT2, each through the contact electrode 35, quenching resistor QR, and second signal line SL2. This arrangement makes the outputs of the respective pixels P2 connected to the second output terminal OT2.

Connected to each first portion of the first signal line SL1 are the other ends of the quenching resistors QR of the pixels P1 included in the first pixel region PA1 in which the pertinent first portion is located. Connected to each first portion of the second signal line SL2 are the other ends of the quenching resistors QR of the pixels P2 included in the second pixel region PA2 in which the pertinent first portion is located. Namely, in the present embodiment, the other ends of four quenching resistors QR are connected to one first portion.

The first output terminal OT1 and second output terminal OT2 are disposed on the insulating layer 31 and function as electrode pads. The first output terminal OT1 and second output terminal OT2 are made, for example, of aluminum or the like. The first output terminal OT1 and second output terminal OT2 are electrically connected to respective electrode pads 15 disposed on the bottom 11. In the present embodiment, the first output terminal OT1 and second output terminal OT2 are electrically connected to the respective electrode pads 15 by wire bonding.

In the pn junction, the p-type semiconductor region constitutes an anode, while the n-type semiconductor region does a cathode. When a drive voltage is applied to a photodiode so that an electric potential of the p-type semiconductor region is higher than an electric potential of the n-type semiconductor region, the drive voltage is a forward bias voltage. When the drive voltage is applied to the photodiode so that the electric potential of the p-type semiconductor region is lower than the electric potential of the n-type semiconductor region, the drive voltage is a reverse bias voltage.

In the photodiode array PDA, the drive voltage for each photodiode PD is set to the reverse bias voltage. If the drive voltage is set not less than the breakdown voltage of the photodiode PD, avalanche breakdown occurs in the photodiode PD and the photodiode PD operates in Geiger mode. Namely, each photodiode PD is an avalanche photodiode (APD).

When light (photons) is incident into the photodiode PD, photoelectric conversion takes place inside the semiconductor substrate 21 to generate carriers (electron-hole pairs). Avalanche multiplication is induced in the vicinity of the pn junction interface of the semiconductor region 25 and a group of multiplied electrons flow toward the electrode 29. An electric current flows in the pixel P1 or P2 where electron avalanche has occurred in the photodiode PD. For this reason, a voltage drop takes place at the quenching resistor QR connected in series to the pixel P1 or P2 (photodiode PD). This voltage drop lowers the voltage applied to the multiplication region of the photodiode PD, ending the multiplication action based on electron avalanche.

The filter film F is disposed on each first pixel region PA1 so as to cover each first pixel region PA1. In the present embodiment, the filter film F is directly formed on the insulating layer 33. Namely, the filter film F is formed on the semiconductor substrate 21 (specifically, on regions corresponding to the first pixel regions PA1) through the insulating layers 31, 33.

The filter film F is not formed on each second pixel region PA2 and thus each second pixel region PA2 is not covered by the filter film F. In the present embodiment, the filter film F is not formed at positions corresponding to the second portions of the first and second signal lines SL1, SL2, either. It is a matter of course that the filter film F may also be formed at the positions corresponding to the second portions of the first and second signal lines SL1, SL2.

The filter film F lowers the transmittance in the detection target wavelength range in the UV region. In the present embodiment, the detection target wavelength range of the UV sensor UVS is the wavelength range (approximately 200 to 280 nm) of the UV-C rays. The filter film F is comprised of a polyparaxylylene resin. The polyparaxylylene resin has an optical property to absorb UV rays of not more than approximately 280 nm. Examples of the polyparaxylylene resin to be used herein include polyparaxylylene (Parylene N (product name)), polymonochloroparaxylylene (Parylene C (product name)), polydichloroparaxylylene (Parylene D (product name)), polytetrafluoroparaxylylene (Parylene III (product name)), and so on.

The filter film F may be comprised of a silicone resin. The silicone resin also has the optical property to absorb UV rays of not more than approximately 280 nm as the polyparaxylylene resin does.

Light is incident to the pixels P1 (photodiodes PD) included in the first pixel regions PA1, after passing through the filter film F. Light is incident to the pixels P2 (photodiodes PD) included in the second pixel regions PA2, without passing through the filter film F. Namely, the light that has been weakened in UV intensity in the detection target wavelength range by the filter film F is incident to the pixels P1 included in the first pixel regions PA1. The light that is not weakened in UV intensity in the detection target wavelength range is incident to the pixels P2 included in the second pixel regions PA2. The weakening of UV intensity in the detection target wavelength range embraces removal of UV rays in the detection target wavelength range as well.

Figure 6:
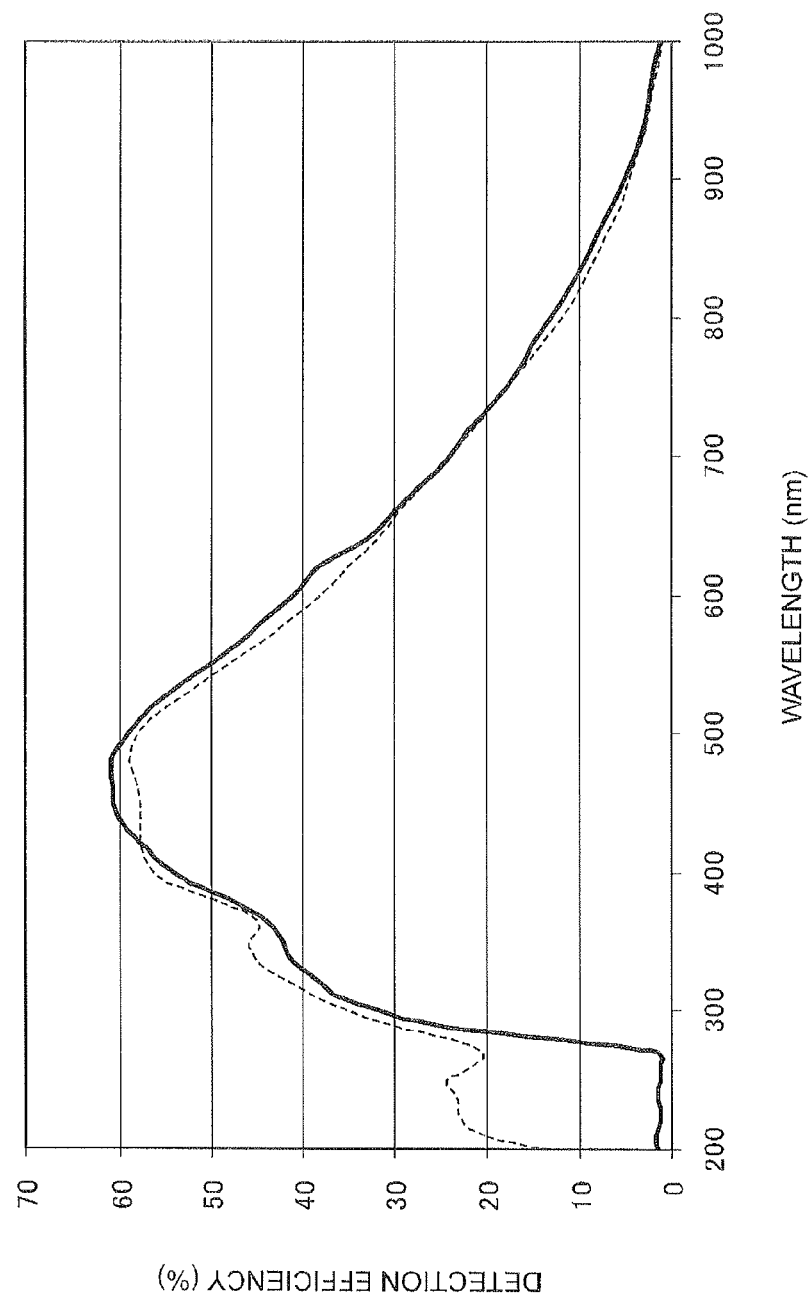
FIG. 6 is a diagrammatic drawing showing relationships between wavelength of incident light and photon detection efficiency.

FIG. 6 is a diagrammatic drawing showing relationships between wavelength [nm] of incident light and photon detection efficiency [%]. In FIG. 6, a solid line indicates photon detection efficiencies in the photodiodes PD of the pixels P1 included in the first pixel regions PA1. A dashed line indicates photon detection efficiencies in the photodiodes PD of the pixels P2 included in the second pixel regions PA2. As seen from FIG. 6, the detection efficiencies of the photodiodes PD of the pixels P1 are kept low in the detection target wavelength range (approximately 200 to 280 nm) because the filter film F is disposed over the first pixel regions PA1. In contrast to it, since the filter film F is not disposed over the second pixel regions PA2, the detection efficiencies of the photodiodes PD of the pixels P2 are not lowered in the detection target wavelength range (approximately 200 to 280 nm).

The condenser lens CL is disposed on the package 10 so as to close one end of the package 10. The condenser lens CL is disposed so as to face the photodiode array PDA, and condenses incident light. In the present embodiment, the condenser lens CL is a Fresnel lens. The condenser lens CL may be a convex lens.

Asperity 39 is formed on a light exit surface of the condenser lens CL. This asperity 39 causes scattering of light when the light condensed by the condenser lens CL emerges from the condenser lens CL. Namely, the asperity 39 formed on the light exit surface of the condenser lens CL functions as a scattering section that scatters incident light to output scattered light. The light exit surface of the condenser lens CL is disposed to face the photodiode array PDA.

In the present embodiment, as described above, each first pixel region PA1 includes the pixels P1 each of which includes the photodiode PD (APD) to operate in Geiger mode, and the quenching resistor QR connected in series to the photodiode PD. Each second pixel region PA2 includes the pixels P2 each of which includes the photodiode PD (APD) to operate in Geiger mode, and the quenching resistor QR connected in series to the photodiode PD. When the light incident to the first pixel region PA1 is incident into the photodiodes PD operating in Geiger mode, the light is absorbed in the photodiodes PD to generate carriers. When the light incident to the second pixel region PA2 is incident into the photodiodes PD operating in Geiger mode, the light is absorbed in the photodiodes PD to generate carriers. In the photodiodes PD, the generated carriers are subjected to avalanche multiplication. Therefore, the UV sensor UVS can achieve a sufficient detection sensitivity characteristic even if the intensity of the light incident to the UV sensor UVS is low.

The first pixel regions PA1 and the second pixel regions PA2 are two-dimensionally disposed, alternately disposed in the first direction D1, and also alternately disposed in the second direction D2. This configuration further prevents the light incident to the UV sensor UVS from being incident into only either one of the first and second pixel regions PA1, PA2. It also further prevents the light incident to the UV sensor UVS from being disproportionately incident into either one of the first and second pixel regions PA1, PA2. These suppress the occurrence of variation in detection accuracy arising from positions of incidence of light to the UV sensor UVS, whereby the UV sensor UVS can achieve higher detection accuracy.

The filter film F is disposed on each first pixel region PA1 so as to cover each first pixel region PA1, except on each second pixel region PA2. For this reason, positional deviation is hard to occur between the filter film F and the first and second pixel regions PA1, PA2. Therefore, the light having passed through the filter film F is definitely incident to the first pixel regions PA1, but the light having passed through the filter film F is never incident to the second pixel regions PA2. This also allows the UV sensor UVS to achieve sufficient detection accuracy. In the present embodiment, the filter film F is formed directly on the photodiode array PDA.

If the filter film F is separated from the photodiode array PDA, highly accurate alignment will be required between the filter film F and the photodiode array PDA and it will be necessary to adopt a new configuration for preventing the light having passed through the filter film F from being incident into the second pixel regions PA2. This would cause new problems of cost increase and complication of structure, for realizing sufficient detection sensitivity. In contrast to it, the present embodiment allows the UV sensor UVS to achieve the sufficient detection accuracy at low cost and in the simple configuration.

The output from the photodiodes PD included in each first pixel region PA1 can be taken out from the first output terminal OT1 through the first signal line SL1 and the output from the photodiodes PD included in each second pixel region PA2 can be taken out from the second output terminal OT2 through the second signal line SL2, independently of each other. Extracted from the first output terminal OT1 is the output based on the light entering the photodiodes PD (pixels P1) after passing through the filter film F. Extracted from the second output terminal OT2 is the output based on the light entering the photodiodes PD (pixels P2) without passing through the filter film F. Therefore, by comparing the output from the first output terminal OT1 with the output from the second output terminal OT2 by use of the UV sensor UVS, it becomes feasible to detect the light in the detection target wavelength range in the UV region.

Figure 7:
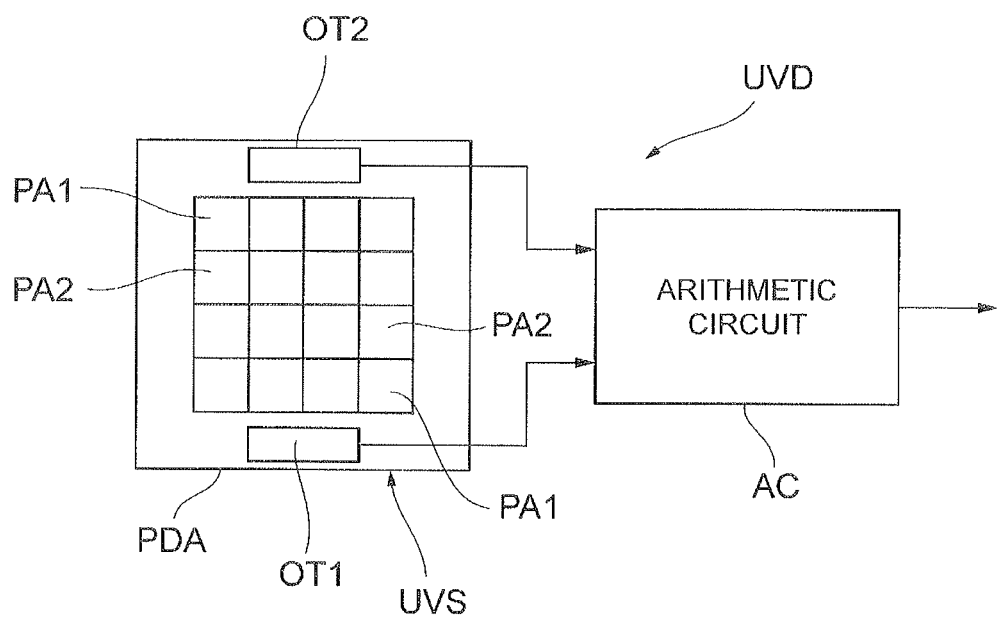
FIG. 7 is a block diagram of a UV detecting device according to the embodiment.

A configuration of a UV detecting device using the UV sensor UVS will be described with reference to FIG. 7. FIG. 7 is a block diagram of the UV detecting device according to the present embodiment.

The UV detecting device UVD includes the UV sensor UVS and an arithmetic circuit AC. The arithmetic circuit AC calculates a difference between the output from the first output terminal OT1 and the output from the second output terminal OT2 and detects the light in the detection target wavelength range in the UV region, based on the difference. The UV detecting device UVD may be configured to calculate the intensity of the light in the detection target wavelength range in the UV region.

Figure 8:
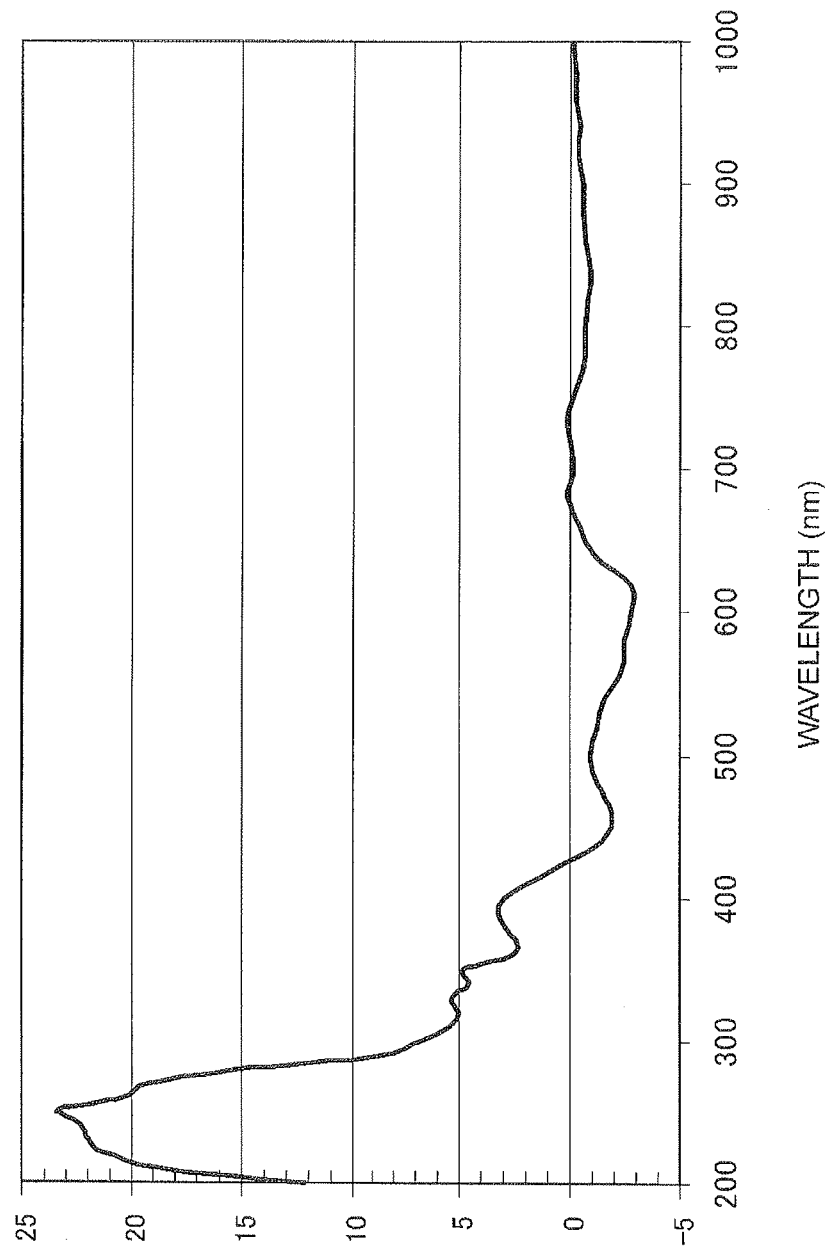
FIG. 8 is a diagrammatic drawing showing a relationship between wavelength of incident light and difference of photon detection efficiencies [%].

FIG. 8 is a diagrammatic drawing showing a relationship between wavelength [nm] of incident light and difference [%] of photon detection efficiencies. FIG. 8 shows differences between detection efficiencies of the photodiodes PD of the pixels P1 included in the first pixel regions PA1 and detection efficiencies of the photodiodes PD of the pixels P2 included in the second pixel regions PA2. A difference between detection efficiencies corresponds to a detection efficiency of the UV detecting device UVD which calculates the difference between the output from the first output terminal OT1 and the output from the second output terminal OT2. Namely, the UV detecting device UVD has high detection efficiencies in the detection target wavelength range in the UV region.

Since the UV detecting device UVD of the present embodiment is equipped with the UV sensor UVS, it can achieve a sufficient detection sensitivity characteristic and sufficient detection accuracy.

The filter film F is comprised of the polyparaxylylene resin. This can lower the transmittance, particularly, in the wavelength region on the short wavelength side such as the UV-C rays, as the detection target wavelength range in the UV region. Since the filter film F is disposed on each first pixel region PA1 except on each second pixel region PA2, the filter film F needs to be formed by patterning. It is easy to implement the patterning of the polyparaxylylene resin. Therefore, the filter film F is surely and easily formed on each first pixel region PA1 except on each second pixel region PA2.

Since the UV sensor UVS is provided with the condenser lens CL, the light condensing capability is enhanced in the UV sensor UVS. For this reason, it can expand a range where light can be incident into the UV sensor UVS.

The asperity 39 is formed on the light exit surface of the condenser lens CL. This configuration further prevents the light incident to the UV sensor UVS from being incident into only either one of the first and second pixel regions PA1, PA2. It also further prevents the light incident to the UV sensor UVS from being disproportionately incident into either one of the first and second pixel regions PA1, PA2. Because of these, the UV sensor UVS can achieve higher detection accuracy.

Figure 9:
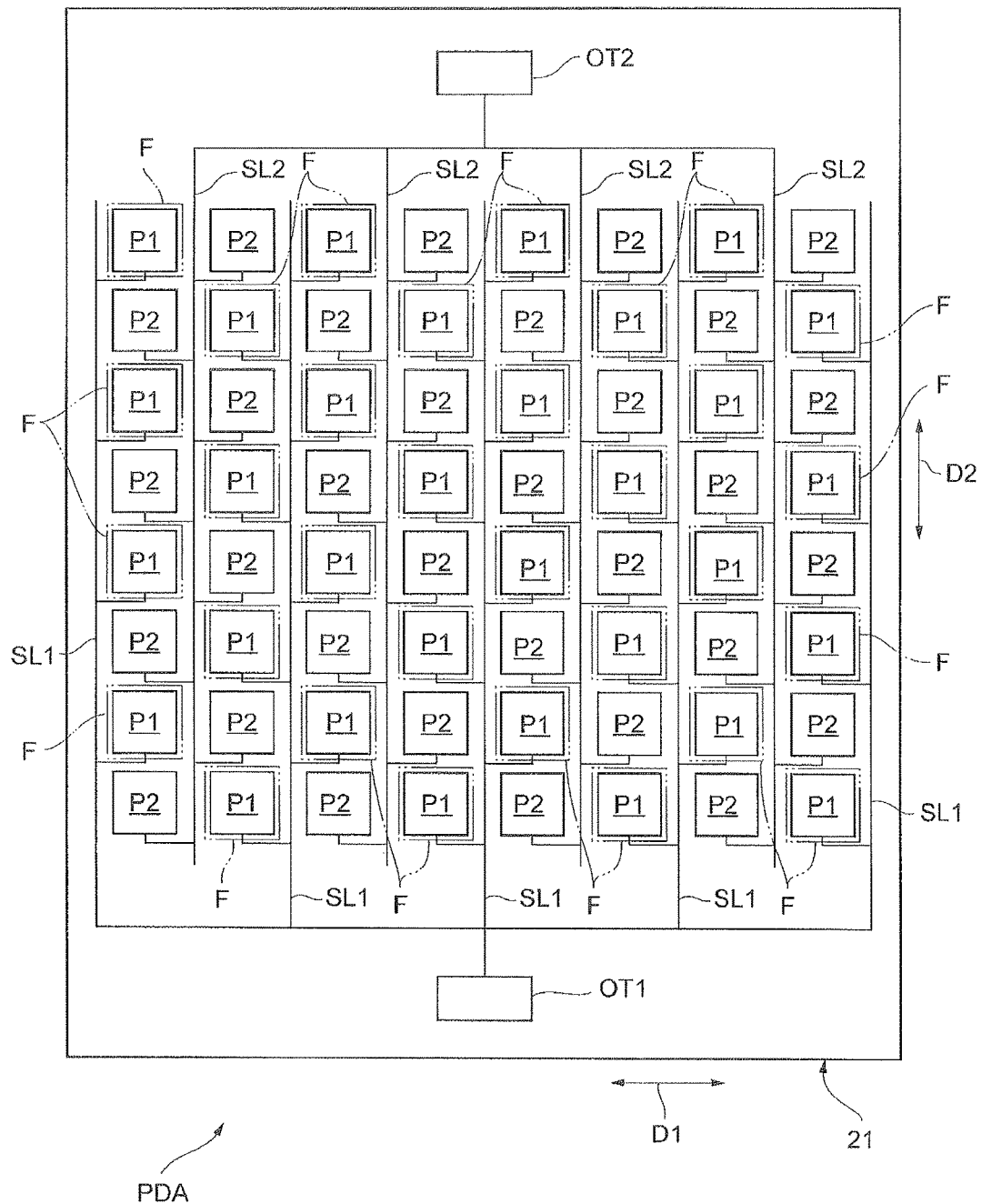
FIG. 9 is a plan view showing a silicon photodiode array, which a UV sensor according to a modification example of the embodiment includes.
Figure 10:
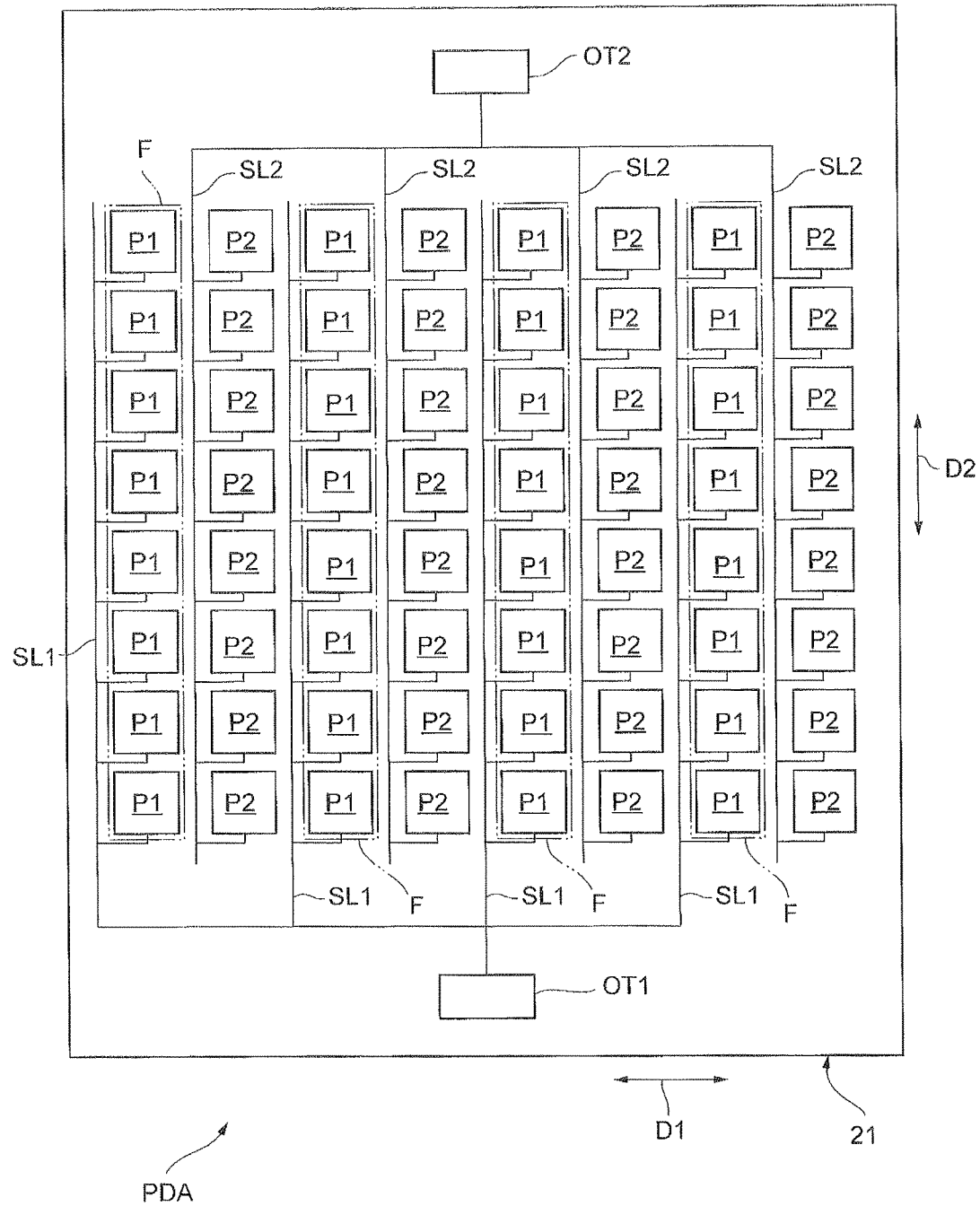
FIG. 10 is a plan view showing a silicon photodiode array, which a UV sensor according to a modification example of the embodiment includes.

Next, configurations of UV sensors UVS according to modification examples will be described with reference to FIG. 9 and FIG. 10. FIG. 9 and FIG. 10 are plan views showing respective silicon photodiode arrays, which the UV sensors of the modification examples include. FIGS. 9 and 10 are drawn without illustration of the insulating layers 31, 33.

In the UV sensors UVS shown in FIGS. 9 and 10, each first pixel region PA1 is comprised of one pixel P1 (photodiode PD) and each second pixel region PA2 is also comprised of one pixel P2 (photodiode PD). The filter film F is disposed on each pixel P1 so as to cover each pixel P1. The filter film F is formed on the pixels P1 (photodiodes PD) through the insulating layers 31, 33 (not shown in FIGS. 9 and 10). The filter film F is not disposed on each pixel P2.

In the modification example shown in FIG. 9, the pixels P1 and the pixels P2 are alternately disposed in the first direction D1 and in the second direction D2. In the modification example shown in FIG. 10, columns each consisting of a plurality of pixels P1 aligned in the second direction D2 and columns each consisting of a plurality of pixels P2 aligned in the second direction D2 are alternately disposed in the first direction D1. Namely, the pixels P1 and the pixels P2 are alternately disposed in the first direction D1.

In either of the modification examples, the UV sensor UVS can achieve a sufficient detection sensitivity characteristic and sufficient detection accuracy.

Figure 11:
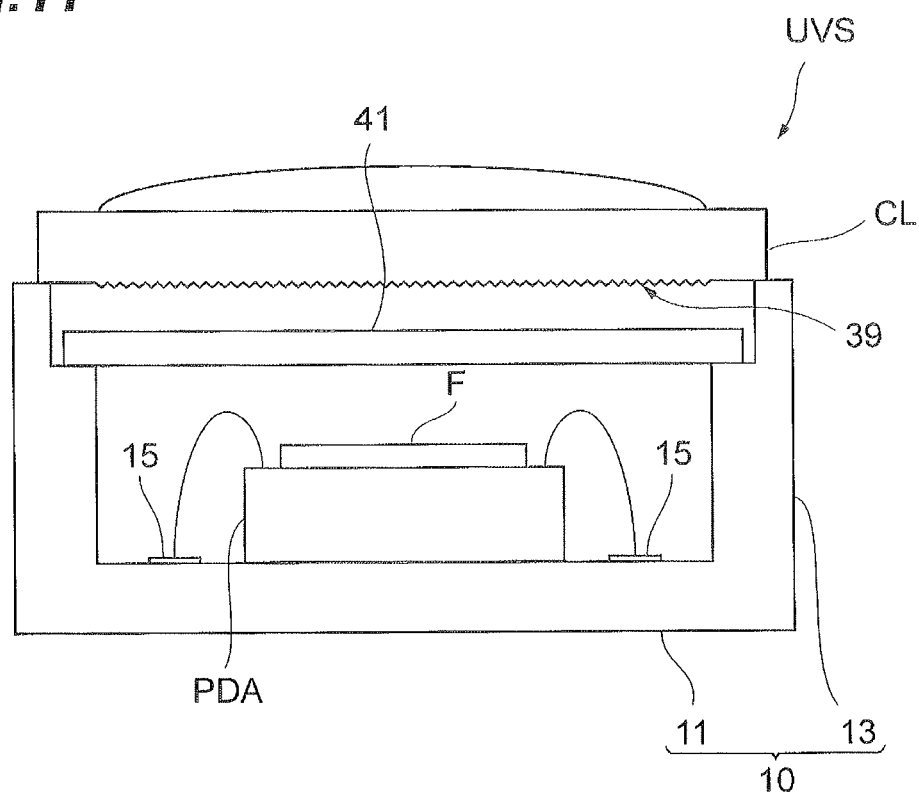
FIG. 11 is a conceptual drawing for explaining a cross-sectional configuration of a UV sensor according to a modification example of the embodiment.

Next, a configuration of a UV sensor UVS according to another modification example will be described with reference to FIG. 11. FIG. 11 is a conceptual diagram for explaining a cross-sectional configuration of the UV sensor according to the present modification example.

In the modification example shown in FIG. 11, the UV sensor UVS includes the package 10, the photodiode array PDA, the filter film F, the condenser lens CL, and a visible light filter 41. In the present modification example, a convex lens is adopted as the condenser lens CL. The condenser lens CL may be a Fresnel lens.

The visible light filter 41 is disposed so as to face the photodiode array PDA and is configured to cut light of wavelengths in the visible region traveling toward the photodiode array PDA. The visible light filter 41 is located between the photodiode array PDA and the condenser lens CL so as to cover all the first pixel regions PA1 and second pixel regions PA2. Light having passed through the visible light filter 41 is incident to the first pixel regions PA1 and to the second pixel regions PA2.

A spectral sensitivity characteristic of the photodiodes PD (APD) has a peak in the visible region in general. For this reason, if the quantity of light is higher in the visible region as ambient light than the quantity of light in the UV region, the output from the photodiodes PD could become saturated. When the output from the photodiodes PD becomes saturated, it becomes difficult to detect the light in the detection target wavelength range in the UV region.

When it is assumed that light of the wavelength 255 nm is incident with the power of 1 pW/cm$^2$ to the photodiode array PDA, the number of incident photons is $1.28 \times 10^4$ [photons/mm$^2$/sec]. When the photodiode array PDA is assumed to have the sensitivity of 30% to the UV-C rays, a photon count (signal amount) of UV-C rays that the photodiode array PDA can detect is $3.84 \times 10^3$ [counts/sec/mm$^2$] (=the number of incident photons×sensitivity).

When background light is assumed to have the illuminance at a level of interior illumination, the number of incident photons of ambient light incident to the photodiode array PDA is $1 \times 10^{11}$ [photons/mm$^2$/sec]. When an average sensitivity to ambient light is assumed to be 30%, a photon count of ambient light detected by the photodiode array PDA is $3 \times 10^{10}$ [counts/sec/mm$^2$]. A detection fluctuation component (shot noise) is superimposed on the detected photon count. The photon count of this shot noise is believed to be $1.75 \times 10^5$ [counts/sec/mm$^2$] (=square root of (the photon count of ambient light detected by the photodiode array PDA)).

Since the photon count of shot noise is extremely larger than the photon count (signal amount) of UV-C rays detected, the photon count (signal amount) of UV-C rays detected is buried in the shot noise caused by ambient light. As a result, it is difficult to implement sensing of the UV-C rays in the detection target wavelength range. In contrast to it, when the UV sensor UVS is provided with the visible light filter 41, the light in the visible region as ambient light is prevented from being incident into the photodiode array PDA. For this reason, the UV sensor UVS shown in FIG. 11 can prevent the output from the photodiodes PD from becoming saturated. It is noted that the visible light filter 41 is not always indispensable if the UV sensor UVS is used under environments where visible light as background light is relatively little (e.g., in a dark box).

Figure 12:
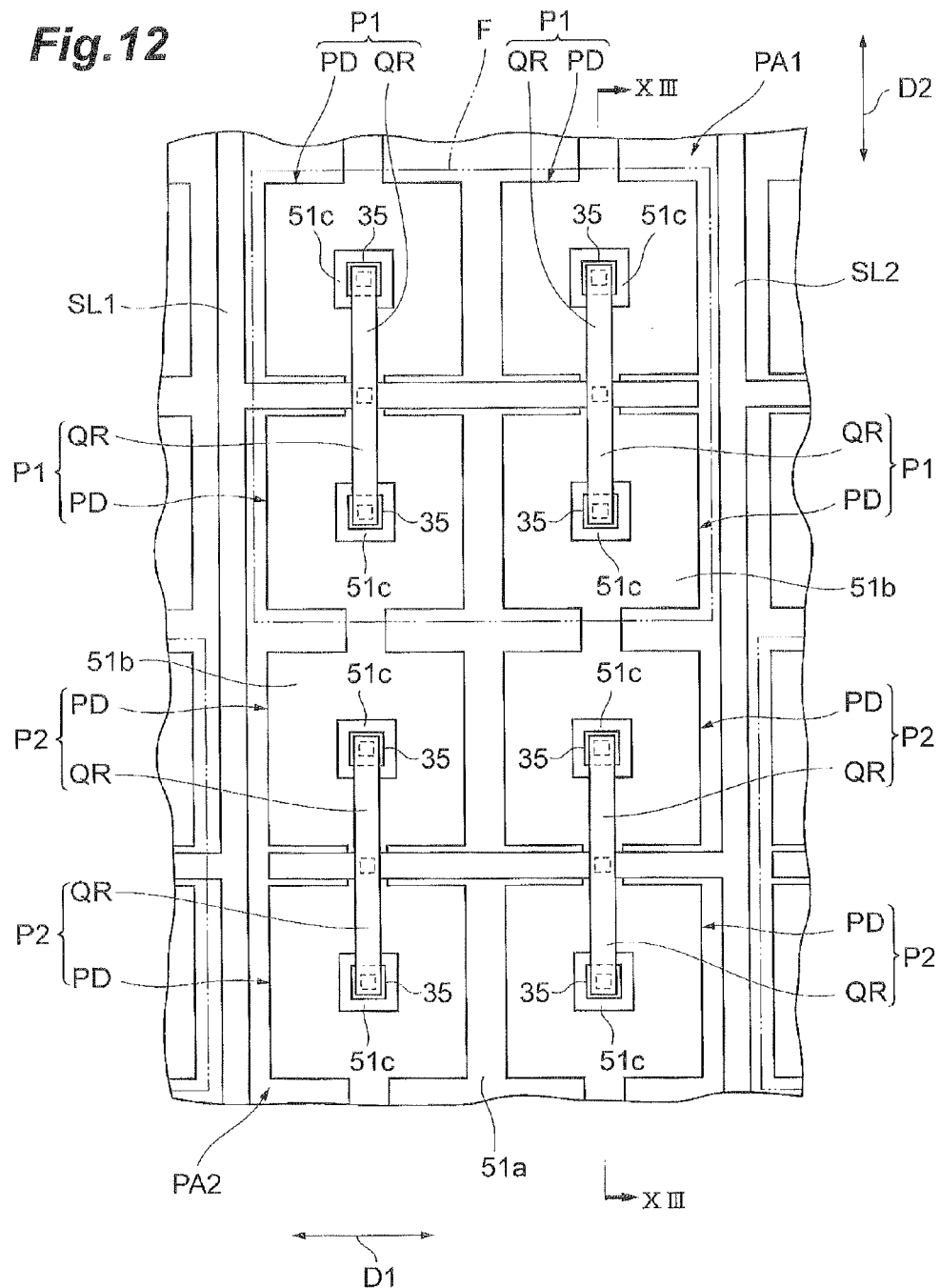
FIG. 12 is a plan view showing a silicon photodiode array, which a UV sensor according to a modification example of the embodiment includes.

Next, a configuration of a UV sensor UVS according to still another modification example will be described with reference to FIGS. 12 and 13. FIG. 12 is a plan view showing the silicon photodiode array, which the UV sensor of the present modification example includes. FIG. 13 is a drawing for explaining a cross-sectional configuration along the line XIII-XIII in FIG. 12.

In the present modification example, the semiconductor substrate 21 is an SOI (Silicon on Insulator) substrate. The semiconductor substrate 21 includes a semiconductor region (layer) 23 located on the principal surface 21b side, and an epitaxial semiconductor layer 51 located on the principal surface 21a side. The epitaxial semiconductor layer 51 is formed through an insulating layer 53 on the semiconductor region 23. The insulating layer 53 is comprised, for example, of a silicon oxide film (SiO$_2$) or the like.

The epitaxial semiconductor layer 51 includes semiconductor regions 51a of the first conductivity type and semiconductor regions 51b, 51c of the second conductivity type. An impurity concentration of the semiconductor regions 51a is higher than that of the semiconductor region 23. An impurity concentration of the semiconductor regions 51c is higher than that of the semiconductor regions 51b. In the present modification example, the semiconductor regions 51a and semiconductor regions 51b constitute pn junctions. Namely, the photodiodes PD (APD) are formed in the epitaxial semiconductor layer 51.

Each semiconductor region 51c is located inside the semiconductor region 51b so as to be surrounded by the semiconductor region 51b. Each semiconductor region 51a is located outside the semiconductor region 51b so as to surround the semiconductor region 51b. The semiconductor region 51c is connected through the contact electrode 35 to one end of the quenching resistor QR.

The thickness of the epitaxial semiconductor layer 51 is relatively small and is set to the thickness enough to lower the sensitivity in the visible region but not to lower the sensitivity in the UV region. This configuration allows the UV sensor UVS of the present modification example to prevent the output from the avalanche photodiodes from becoming saturated. The thickness of the epitaxial semiconductor layer 51 is set, for example, to 205±20 nm. In this case, the UV sensor UVS becomes hard to have sensitivity to light in the wavelength range of not less than 280 nm. The thickness of the insulating layer 53 is set, for example, to about 200 nm.

The embodiment of the present invention was described above, and it should be noted that the present invention is by no means intended to be limited to the above-described embodiment and can be modified in many ways without departing from the spirit and scope of the invention.

The numbers of first and second pixel region PA1, PA2 and the numbers of pixels P1, P2 included in the first and second pixel regions PA1, PA2, respectively, do not have to be limited to the numbers described above. The total number of first pixel regions PA1 does not always have to be the same as the total number of second pixel regions PA2. When the total number of first pixel regions PA1 is different from that of second pixel regions PA2, the output from either one of the first pixel regions PA1 and the second pixel regions PA2 is corrected, whereby the light in the detection target wavelength range in the UV region can be detected. However, the total number of first pixel regions PA1 may be the same as that of second pixel regions PA2 because the light in the detection target wavelength range can be suitably detected by the simple operation when the total number of first pixel regions PA1 is the same as that of second pixel regions PA2. The total number of pixels P1 in each first pixel region PA1 does not always have to be the same as that of pixels P2 in each second pixel region PA2, but the total number of pixels P1 in each first pixel region PA1 may be the same as that of pixels P2 in each second pixel region PA2.

It is sufficient for the quenching resistor QR to be connected in series to the photodiode PD, and the shape thereof, the connection position to the semiconductor region 27 (contact electrode 35) when viewed from the light incidence direction, and others do not have to be limited to the modes described in the above embodiment and modification examples. The positions of the semiconductor regions 51c when viewed from the light incidence direction are not limited to the positions described in the above modification example, either.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An ultraviolet sensor comprising:
a silicon photodiode array having a plurality of first pixel regions and a plurality of second pixel regions, which are alternately disposed in a first direction;
a filter film lowering transmittance in a detection target wavelength range in the ultraviolet region;
a first output terminal connected to outputs of the plurality of first pixel regions; and
a second output terminal connected to outputs of the plurality of second pixel regions,
wherein the filter film is disposed on each of the first pixel regions so as to cover each first pixel region, except on each second pixel region,
wherein each of each first pixel region and each second pixel region includes at least one pixel including an avalanche photodiode to operate in Geiger mode, and a quenching resistor connected in series to the avalanche photodiode,
wherein each of the quenching resistors in the plurality of first pixel regions is connected through a first signal line to the first output terminal, and
wherein each of the quenching resistors in the plurality of second pixel regions is connected through a second signal line to the second output terminal.

2. The ultraviolet sensor according to claim 1, wherein the plurality of first pixel regions and the plurality of second pixel regions are two-dimensionally disposed and are also alternately disposed in a second direction perpendicular to the first direction.

3. The ultraviolet sensor according to claim 1, wherein the filter film is comprised of a polyparaxylylene resin.

4. The ultraviolet sensor according to claim 1, further comprising:
a condenser lens disposed so as to face the silicon photodiode array, and configured to condense incident light.

5. The ultraviolet sensor according to claim 1, further comprising:
a scattering section disposed so as to face the silicon photodiode array, and configured to scatter incident light to output scattered light.

6. The ultraviolet sensor according to claim 1, further comprising:
a filter disposed so as to face the silicon photodiode array, and configured to cut light of wavelengths in the visible region traveling toward the silicon photodiode array.

7. The ultraviolet sensor according to claim 1, wherein the silicon photodiode array includes a silicon semiconductor substrate on which an epitaxial semiconductor layer is formed through an insulating layer, and
wherein the avalanche photodiodes are formed in the epitaxial semiconductor layer.

8. An ultraviolet detecting device comprising:
the ultraviolet sensor as defined in claim 1,
the ultraviolet detecting device being configured to detect light in the detection target wavelength range in the ultraviolet region, based on a difference between an output from the first output terminal and an output from the second output terminal.

* * * * *